United States Patent [19]

Kobashi

[11] Patent Number: 5,743,957
[45] Date of Patent: Apr. 28, 1998

[54] METHOD FOR FORMING A SINGLE CRYSTAL DIAMOND FILM

[75] Inventor: Koji Kobashi, Kobe, Japan

[73] Assignee: Kabushiki Kaisha Kobe Seiko Sho, Kobe, Japan

[21] Appl. No.: 680,612

[22] Filed: Jul. 16, 1996

[30] Foreign Application Priority Data

Aug. 4, 1995 [JP] Japan .................................. 7-219624

[51] Int. Cl.$^6$ ........................... C30B 29/04; C23C 16/26
[52] U.S. Cl. ........................... 117/929; 427/249; 427/560; 427/533; 427/299
[58] Field of Search .................................. 427/249, 560, 427/533, 299; 117/929

[56] References Cited

U.S. PATENT DOCUMENTS

| 5,298,286 | 3/1994 | Yang et al. |
|---|---|---|
| 5,479,875 | 1/1996 | Tachibana et al. ............ 117/103 |

FOREIGN PATENT DOCUMENTS

| 0 322 812 | 7/1989 | European Pat. Off. |
| 0 440 384 | 8/1991 | European Pat. Off. |
| 0 492 159 | 7/1992 | European Pat. Off. |
| 0 534 729 | 3/1993 | European Pat. Off. |
| 0 598 361 | 5/1994 | European Pat. Off. |
| 0 636 706 | 2/1995 | European Pat. Off. |
| 8-151296 | 6/1996 | Japan . |
| 2 295 401 | 5/1996 | United Kingdom . |
| 2 295 402 | 5/1996 | United Kingdom . |

OTHER PUBLICATIONS

Patent Abstracts of Japan, vol. 18, No. 664 (C–1288)(7004), JP-A-6 263593, Sep. 20, 1994.
Database WPI, Derwent Publications, AN 94–283741/35, JP-A-6 212428, Aug. 2, 1994.

Primary Examiner—Roy V. King
Attorney, Agent, or Firm—Oblon, Spivak, McClelland, Maier & Neustadt, P.C.

[57] ABSTRACT

A method of forming a single crystal diamond film in which a single crystal diamond film of large area can be formed at low cost, thereby making it possible to realize a large improvement in the properties of the diamond and also making possible the practical use of diamond in a wide range of applications thereof, said method comprising the steps of: first vapor-depositing a platinum film 2 on a first substrate 1, pressing a second substrate 3 onto the platinum film 2, and carrying out annealing in a vacuum. Next the platinum film 2 and the first substrate 1 are mechanically separated from each other, and the join surface 2a of the platinum film that had once been joined to the first substrate 1 is subjected to a surface scratching treatment, after which diamond is formed by gas-phase synthesis on this join face 2a. A single crystal diamond film is obtained in this way. In the case that the vapor-deposited platinum film has a thickness of no less than 20 μm, the platinum film 2 and the first substrate 1 can be mechanically separated from one another without pressing a second substrate 3 onto the platinum film 2, and a single crystal diamond film can be similarly formed by the gas-phase synthesis of diamond on the join face 2a of the platinum film 2 that had once been joined to the first substrate 1.

12 Claims, 6 Drawing Sheets

20.0 μm 15.0 μm

METHOD FOR FORMING A SINGLE CRYSTAL DIAMOND FILM

FIELD OF THE INVENTION

The present invention relates to a method of forming single crystal diamond films for application in electronic devices such as transistors, diodes, all types of sensors etc., heat sinks, surface acoustic wave devices, X-ray windows, optic materials, wear-resistant materials, decorative materials, and the coatings etc. thereof.

DESCRIPTION OF THE PRIOR ART

Diamond is characterised by it's excellent heat resistance, and a large energy gap of 5.5 eV. Normally, it is an insulator, but it is possible to obtain semi-conducting diamond by doping with impurities. In addition, diamond also displays excellent electrical characteristics in that it has a high dielectric breakdown voltage, a high saturation drift velocity and a small dielectric constant. It is expected that these electrical characteristics can be exploited to use diamond as a material for electronic devices and sensors to be used at high temperatures, at high frequencies or in high electrical fields.

Furthermore, research is also being carried out into: (i) the exploitation of the large energy gap of diamond to use diamond in optical sensors and light emitting elements which can also cope with waves in the short wavelength region such as ultra-violet waves; (ii) the exploitation of the large heat conductivity and small specific heat of diamond to use diamond as a heat sink material; (iii) the exploitation of the property of diamond of being the hardest of all substances, to use it in surface acoustic wave devices; (iv) the exploitation of the high optical transmission and refractive index of diamond to use it in X-ray windows and optical materials.

In order to bring out to a maximum these characteristics of diamond with a view to its application in various materials, it is necessary to synthesize high-quality single crystal diamond in which the crystal structural defects have been reduced. Furthermore, in order to render feasible the practical application of single crystal diamond films, the development of a method by which large area single crystal diamond films at low cost can be produced is required. At present, single crystal diamonds are obtained by the mining of natural diamond, or by their artificial synthesis under high temperature and high pressure conditions. Such single crystals of diamond, known as bulk diamond, be they obtained naturally or by high temperature-high pressure synthesis, have a maximum crystal face area in the order of 1 cm$^2$, and are extremely expensive. Accordingly, they are only used industrially in specific fields such as polishing powders and precision cutting tool tips.

On the other hand, the gas-phase synthesis of multi-crystal diamond films by microwave chemical vapour deposition (microwave CVD) methods (Japanese Patent Publication No. Sho 59-27754 and No. Sho 61-3320), hot filament CVD methods, direct current (DC) plasma CVD methods, plasma jet methods, combustion methods, and hot CVD methods etc. is also known. These gas-phase synthesis methods, are all characterised by the possibility to form diamond films having high areas at low cost.

However, diamond films formed according to one of these methods on non-diamond substrates such as silicon, are generally multi-crystals in which the diamond particles cohere together in an unorderly manner. As shown in the electron microscope photograph of FIG. 4, grain boundaries exist in high density in this multi-crystal diamond. It has been reported that it is possible to synthesize a highly oriented film in which the diamond crystalline particles are virtually all aligned in a certain same direction, as shown in the electron microscope photograph of FIG. 5. However, these are also multi-crystalline and have a high density of grain boundaries. The grain boundaries cause charged particles, known as carriers, such as electrons, holes etc. which move through the diamond, to become trapped or scattered, and thus even though it is a highly oriented film, it will display inferior electrical characteristics compared to a bulk diamond having few grain boundaries. As a result, there exists the problem that the performance of multi-crystal diamond films is insufficient to make practical use thereof as an electronic device or sensor.

Furthermore, even from an optical standpoint, grain boundaries cause light to be scattered, and therefore the transmittance of a multi-crystal is too low to make practical use thereof as an optical material etc. Furthermore, multi-crystal diamond also has the problem that it is prone to chipping when used as the wear resistant material for a tool etc.

The above-described diamond films are all examples in which the diamond film was synthesized using a non-diamond substrate. However, the properties of synthesized diamond change depending on the substrate used in the gas-phase synthesis. For example, if the substrate used is single crystal bulk diamond or cubic boron nitride, then a single crystal diamond film can be synthesized. However, as mentioned above, even if single crystal bulk diamond or cubic boron nitride is employed as the substrate, a large area single crystal diamond film cannot be obtained.

If nickel or copper is used as the substrate for the gas-phase synthesis, then a diamond film which comprises crystals aligned to a certain degree can be obtained. However, in the case that nickel is used, and a high temperature hydrogen plasma atmosphere is used when synthesizing the diamond, then there is the problem that the nickel becomes fragile, subsequently reacts with the diamond film produced and converts the diamond film to graphite (D. N. Belton and S. J. Schmieg, J.Appl. Phys, Vol. 66, p.4223 (1989)). On the other hand, in the case that copper is used as the substrate, and the temperature is raised to 600° C. or greater as a standard condition to grow diamond in the gas phase, then since the coefficient of linear heat expansion of copper is greater than ten times that of diamond, the diamond peels away from the substrate on cooling to room temperature (J. F. Denstale, et al, J. Materials Science, Vol. 27, p. 553(1992)).

Research has also been made regarding the gas-phase synthesis of diamond using platinum or another transition metal as the substrate, but this method resulted in nothing more than the growth of multi-crystal diamond films or diamond grains, and single crystal diamond films are not formed (Sakamoto, Takamatsu, (Surface & Technology (Hyomen Gijutsu) Vol. 44, No.10, p.47(1993); M. Kawarada, et al, Diamond and Related Materials, Vol. 2, p.1083(1993); D. N. Belton and S. J. Schmeig, J.Appl.Phys., Vol. 69, No.5, p.3032(1991); D. N. Belton and S. J. Schmeig, Surface Science, Vol.223, p.131(1990); Y. G. Ralchenko, et al, Diamond and Related Materials, Vol.2, p.904(1993)).

In order to industrially make practical use of diamond, it has to be possible to synthesize single crystal diamond films having a large area, and in which grain boundaries do not exist at all or only in an extremely low density. However, a method for forming such a single crystal diamond film has not hereto been developed.

The present invention was made in light of these problems, and has as its objective the provision of a method for forming a single crystal diamond film, by which a single crystal diamond film of large area can be synthesized in the gas phase at low cost, thereby making it possible to dramatically improve the properties of diamond as well as making it possible to practically use diamond in a wide range of applications thereof.

SUMMARY OF THE INVENTION

According to the present invention, there is provided a method for forming a single crystal diamond film comprising the step of synthesizing a diamond film on a vapour-deposited film of platinum or a platinum alloy containing at least 50% (at.) platinum whose surface comprises a (001) or (111) crystal face, wherein the surface of the vapour-deposited film upon which the diamond film is synthesized corresponds to the surface of the vapour-deposited film which had been joined to the substrate upon which the vapour-deposited film was formed.

The method for forming a single crystal diamond film according to the present invention preferably comprises the following steps: (i) forming a vapour-deposited film of platinum or a platinum alloy comprised of at least 50% (at.) platinum, on the surface of a first substrate; (ii) annealing the vapour-deposited film; (iii) separating the first substrate and the vapour-deposited film; and (iv) synthesizing a diamond film on the face of the vapour-deposited film which had been joined to the first substrate.

The method may also comprise a step of pressing a second substrate onto the surface of the vapour-deposited film, between steps (i) and (ii), or between steps (ii) and (iii).

The method may also comprise a step of subjecting the "join face" to a surface treatment between steps (iii) and (iv).

The surface treatment may be an ultra-sound wave or buffing scratching treatment using diamond powder or diamond paste, or a carbon ion injection scratching treatment.

The first substrate may be made of one material selected from the following group: lithium fluoride, calcium fluoride, magnesium oxide, nickel oxide, zirconium oxide, aluminum oxide, strontium titanate, barium titanate, lead titanate, gallium tantalate and lithium niobate, whose surface comprises a (111) crystal face or a (001) crystal face. The first substrate may also however comprise silicon, quartz, or glass.

It is preferable that the platinum alloy contain at least one element from group 6A, group 7A, group 8A or group 1B of the periodic table.

It is desirable that the vapour-deposited film be formed at a temperature of no greater than 1000° C., and more preferably at a temperature between 300° C. and 1000° C.

It is desirable that the annealing temperature be no less than 500° C., and more preferably no less than 1000° C.

BRIEF DESCRIPTION OF THE DRAWINGS

These and other objects, features and advantages of the present invention will become more apparent upon a reading of the following detailed description and accompanying drawings in which.

DETAILED DESCRIPTION OF THE INVENTION

Having conducted extensive research as to how to solve the above-described problem, the inventors of the present invention found that a single crystal diamond film can be grown by the gas-phase synthesis of diamond film on the (111) crystal face or (001) crystal face of a vapour-deposited film of platinum or a platinum alloy comprising at least 50% (at.) platinum.

Figure 6:
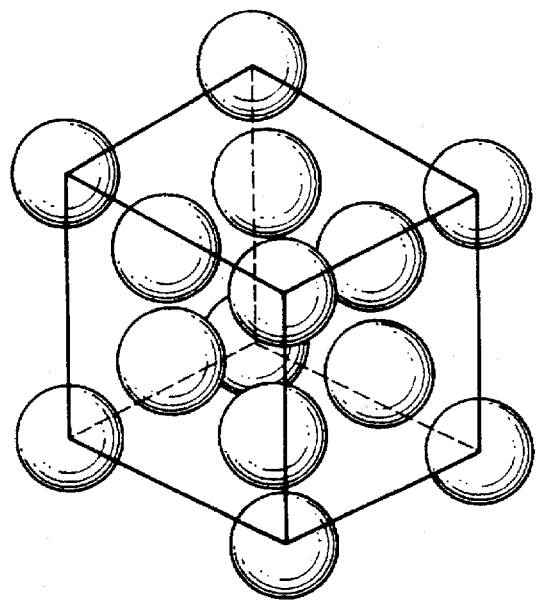
FIG. 6 is a typified view showing the crystal structure (face-centered cubic structure) of platinum.
Figure 7:
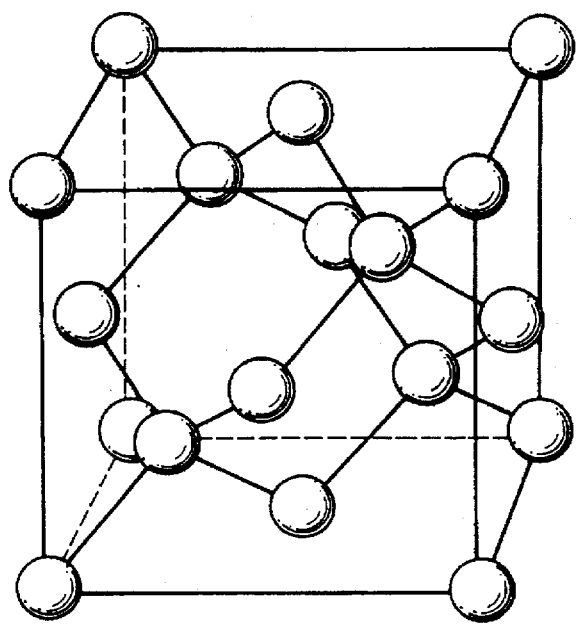
FIG. 7 is a typified view of the crystal structure (diamond structure) of diamond.

According to the conventional theory concerning the growth of single crystal films, the growth of single crystal films of diamond on platinum could not possibly have been anticipated. The first reason for this, is that platinum and diamond have lattice constants of 3.9231 Å and 3.5667 Å respectively, which differ from each other by a factor of about 10%. In a case such as this, when the difference in lattice constants is so large, the growth of a single crystal film can not, in general, be envisaged. The second reason is that, diamond and platinum differ completely in crystal structure. Platinum has a cubic hexagonal crystal structure, as shown in FIG. 6, whereas diamond has the diamond crystal structure shown in FIG. 7. Hence, the structures of diamond and platinum cannot link together in a continuous fashion, and it was thus generally believed that single crystals could not be grown. A technique of forming diamond by gas-phase synthesis (CVD) on platinum foil substrates does in fact exist in the prior art, but this method only produces multi-crystal diamond films in which the diamond grains are oriented in an unorderly fashion.

The fact that single crystal diamond films can be grown on the (111) or (001) crystal faces of platinum, is thought to be due to the following mechanism. Platinum is a metal having a catalytic action, and carbon-containing molecules adsorbed onto the surface thereof are easily decomposed. In the vapour deposition of diamond, chemically active carbon is present on the surface of the substrate in a high concentration. This carbon diffuses into the substrate whilst reacting with the platinum, whereby carbon becomes dissolved to supersaturation in the surface layer of platinum. This carbon is precipitated as diamond nucleii. Other non-diamond structures such as graphite etc. are also generated along with the diamond, but these react readily with the hydrogen or oxygen in the plasma, whereby they are eliminated. Since the carbon dissolves into the interior of the platinum substrate, the orientation of the diamond nucleus itself is determined by the (111) or (001) crystal structure of the interior of the substrate. Thus, even if the surface of the substrate is pitted by scratching treatment, this has no effect on the orientation of the diamond formed, but rather has the effect of promoting the diffusion of carbon into the interior of the substrate.

The use of platinum as the material for the vapour-deposited film is due to the following reason. If nickel is used as the material for the vapour-deposited film, the diamond formed is converted into graphite, due to the strong catalytic action of nickel. Copper has too weak a catalytic action, and also forms only weak bonds with carbon, and thus a sufficient concentration of carbon cannot be dissolved therein. Silicon, which is generally used as the substrate in the gas-phase synthesis of diamond, forms very strong covalent bonds with carbon, thus hindering the formation of a diamond nucleus within the interior of the substrate. In contrast to these materials, platinum displays some degree of catalytic action, but dissolves carbon without reacting with it as strongly as nickel does. Accordingly, platinum is the most suitable material for the vapour-deposited film.

The inventors of the present invention have confirmed that the effect of the present invention can be achieved even if a platinum alloy containing at least 50% (at.) platinum is used instead of platinum. If the components of the platinum alloy other than platinum exceed 50% (at.) the effect of the platinum is weakened, and although diamond is formed, a single crystal diamond film is not formed. In order to exploit the characteristics of platinum and bring out the effect thereof, it is preferable that the platinum be included in an amount no less than 99% (at.).

The non-platinum component(s) may comprise at least one element selected from the following group of elements: Group 6 element such as chromium, molybdenum or tungsten etc.; Group 7 element such as manganese; Group 8A element such as iron, cobalt, iridium, nickel and palladium etc.; Group 1B element such as gold, silver and copper etc. The elements of Group 6A and 7A form stable carbides, and Group 8A elements react strongly with carbon. Group 1B elements do not react with carbon. By mixing these elements together with the platinum, it is possible to control the chemical action of platinum, or to create an additional new chemical effect. Also, it is possible to change the lattice constant by adjusting the mixing ratio, making it effectively possible to control the crystal orientation of the single crystal diamond film with respect to the substrate. Hereunder, the general term "platinum based alloy" shall be used to mean platinum or platinum alloy containing at least 50% (at.) platinum.

At first, the inventors of the present invention, tried to form a single crystal diamond film on the growth surface of a platinum film, which had been formed on a substrate by sputter vapour-deposition or electron beam vapour deposition, and then subjected annealing to produce a single crystal. However, the vapour deposited film was by nature virtually amorphous, making it difficult to form a single crystal by annealing, and thus although a single crystal diamond film was produced, there was the problem that one part of the film corresponding to 20% of the whole film was not produced in single crystal form. The method of the present invention thus comprises the steps of vapour-depositing a platinum based alloy on a first substrate, pressing a second substrate onto the platinum based alloy film, removing the first substrate after carrying out an annealing treatment, and synthesizing in the gas-phase a diamond film on the surface of the platinum based alloy film that had been joined to the first substrate. By doing so, a more complete single crystal diamond film can be obtained. This is because the join face of the platinum based alloy film vapour-deposited onto the first substrate is a virtually complete single-crystal surface, and thus the diamond film synthesized in the gas-phase on this face is similarly a virtually complete single crystal film.

It is generally known that the (111) or (001) crystal faces readily appear, and that other crystal faces do not readily appear, when diamond is synthesized in the gas-phase. Hence, it is essential that the face of the platinum based alloy film joined to the first substrate be a (111) crystal face or a (001) crystal face. It is possible to make the face of the platinum based alloy film joined to the first substrate be a (111) crystal face or a (001) crystal face, by adopting as the substrate one of the following materials having a (111) crystal face or (001) crystal face: lithium fluoride, calcium fluoride, manganese oxide, nickel oxide, zirconium oxide, sapphire (aluminum oxide), strontium titanate, barium titanate, lead titanate, gallium tantalate and lithium niobate; and by forming the platinum film on such a substrate using a method such as sputter vapour deposition, electron beam vapour deposition etc. Accordingly, it is preferred that the surface of the first substrate also comprises a (001) crystal face or a (111) crystal face.

A platinum based alloy is an expensive metal, but since it can be recycled by separating the platinum based alloy film substrate from the diamond film after synthesizing the single crystal diamond film, there is no increase in the manufacturing cost. Platinum based alloy single crystal films having a (111) crystal face or (001) crystal face formed by deposition on substrates made from silicon wafer, quartz or glass, from substrates of these materials having modified surfaces, or from substrates of these materials having a different material vapour-deposited on the surface thereof, involve less manufacturing cost. It is preferable that the platinum based alloy be vapour deposited over the entire surface of the substrate, but it may also be vapour deposited over only a part of the area thereof.

According to the basic principle of the present invention, there is no restriction regarding the thickness of the platinum-based alloy film. However, since the diamond film is to be grown on the face of the platinum-based alloy film that had been joined to the first substrate, if the platinum-based alloy film is made too thin, then there is the fear that the platinum-based alloy film might peel off from the second substrate during the gas-phase synthesis. On the other hand, a long period of time would be required to produce a thick film by vapour deposition. Accordingly, from a practical point of view, the film is made to have a thickness of between 1 µm and 0.5 mm, and preferably to have a thickness of no less than 10 µm. If the platinum-based alloy film is made to have a thickness of greater than about 20 µm, then it can be mechanically peeled from the first substrate without first pressing a second substrate thereon, and subsequently used as the substrate for synthesizing the single crystal diamond film.

In order to make the face of the platinum-based alloy film that is joined to the first substrate into a single crystal face, the substrate should be maintained at a high temperature during the vapour deposition, or a high temperature heat treatment should be performed after the vapour deposition. It is also possible to carry out both these procedures. During vapour deposition the substrate may be kept at a temperature in a range between room temperature and 1000° C., but it is desirable that the substrate be at a high temperature, preferably between 300° C. and 1000° C. Annealing after the vapour deposition should be performed at a temperature of no less than 500° C., and preferably at a temperature of no less than 1000° C. This annealing process is usually performed under vacuum, and by heating using heaters or infra-red lamps. Well known electron beam heat treatment etc. may also be used. In addition, there are many possible variations concerning the raising and lowering of the temperature; for example, the raising and lowering of the temperature could be effected in stages. The ideal period of time for which the annealing treatment should be performed depends on the thickness of the film and the temperature at which the treatment is performed.

The process of growing a single crystal of diamond such that the structure of the crystal face is retained is a standard process. However, the fact, that if a (001) crystal face or a (111) crystal face can be obtained on the face of a platinum-based alloy film that had once been joined to a first substrate, then a single crystal of diamond can be grown on that face, even if the face is roughened by scratching treatment, could in no way have been possibly anticipated from the prior art. However, with the present invention, the method of applying a bias voltage to a substrate in a plasma atmosphere containing carbon, and the more standard methods of ultrasound wave or buffing scratching treatments which use diamond powder or diamond paste, can be used to generate diamond nucleii in the face of the platinum-based alloy film substrate that had been joined to the first substrate, before carrying out the gas-phase synthesis of the diamond film. The same kind of effect can be also achieved by subjecting the surface to carbon ion injection. In the case that the application of a bias voltage is used to generate the diamond nucleii, then a surface treatment is not always necessary.

In the case that the thus obtained single crystal diamond film is to be used in an electronic device or sensor, there is the advantage that the vapour-deposited film can be adopted as it is as an electrode. When the single crystal diamond film is to be used in an optical window or in a heat sink, there is no need for a substrate, and it can be removed by mechanical methods or by chemical methods such as dissolution etc. It is also possible to polish one or both sides of such a self-supporting single crystal diamond film.

With respect to the thickness of the single crystal diamond film, there are no limitations other than it is dependent on the gas-phase synthesis time. Generally, it is possible to produce by gas-phase synthesis a film having a thickness in the range of between about 0.1 μm and a few milimeters. Furthermore, it is for example possible, after first synthesizing a single crystal diamond film on a substrate using a microwave CVD method etc., to produce a rather thicker diamond film using a high-speed film formation method such as a combustion method or a plasma jet method etc.

In order to make the single crystal diamond film into a semiconductor having p-type or n-type semiconducting properties, a gas including boron such as $B_2H_6$ etc. or a gas including phosphorous such as $PH_3$, should be added to the reactant gas at the time of generating the diamond nuclei or producing the single crystal diamond by gas-phase synthesis.

DETAILED DESCRIPTION OF PREFERRED EMBODIMENTS

Figure 1A:
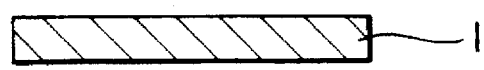
FIGS. 1(a)–1(f) are typified cross-sectional diagrams showing the order of steps of the method of forming a single crystal diamond film according to the first embodiment of the present invention.

Hereunder, embodiments of the present invention shall be specifically described with reference to the attached figures. FIG. 1 is a typified cross-sectional diagram showing the order of steps of the method of forming a single crystal diamond film according to a first embodiment of the present invention. FIG. 1(a) shows a first substrate (1) for which, for example, strontium titanate ($SrTiO_3$) having a (111) crystal face as its main face is used.

Figure 1B:
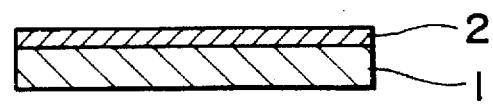

Then, as shown in FIG. 1(b), a platinum film (2) having a thickness of, for example, 30 μm is formed on the main face of the first substrate (1) using a magnetron sputter method.

Figure 1C:
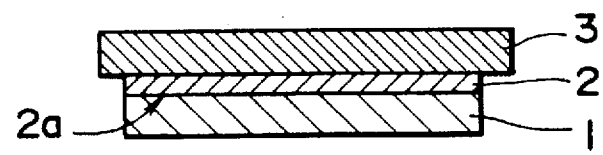

Next, as shown in FIG. 1(c), a second substrate (3), comprising, for example, a Mo sheet having a thickness of 0.3 mm is pressed onto the platinum film (2) and annealing is carried out in a vacuum.

Figure 1D:
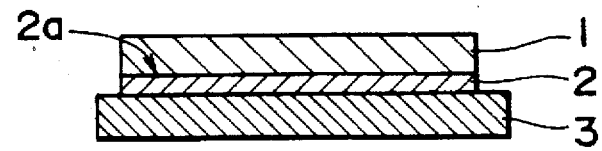

Then, as is shown in FIG. 1(d), the relative vertical position of first and second substrates (1,3) is reversed such that the first substrate (1) lies above the second substrate (3).

Figure 1E:
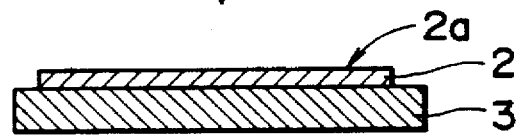

Thereafter, as shown in FIG. 1(e), the platinum film (2) and first substrate (1) are mechanically separated from each other, to expose the face (2a) of the platinum film (2) that had been joined to the first substrate (1). Subsequently, this "join face" (2a) is surface treated by a scratching treatment.

Figure 1F:
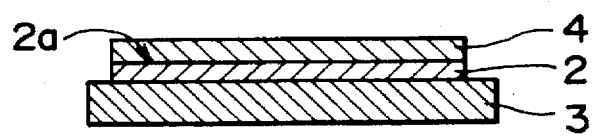

Finally, as shown in FIG. 1(f), a single crystal diamond film (4) is formed on the platinum film (2), by the gas-phase synthesis of diamond on "join face" (2a).

In the method of this embodiment, strontium titanate having a (111) crystal face is employed as the first substrate, and thus the face (join face (2a)) of the platinum film (2) which is joined to the first substrate (1) also becomes a complete (111) face, and thus by forming, by gas-phase synthesis, the diamond on this join face (2a), the diamond film produced also emerges as a virtually complete single crystal having a (111) crystal face. Furthermore, since the area of the diamond film obtained by gas-phase synthesis is dependent on the area of the platinum film substrate, a single crystal diamond film of large area can be formed.

FIG. 2 is a typified cross-sectional diagram showing the order of steps of a method for forming a single crystal diamond film according to a second embodiment of the present invention. The difference between this embodiment and the embodiment shown in FIG. 1, is that the platinum film and the first substrate are separated from each other without first pressing a second substrate onto the platinum film. All the other steps are identical to those steps of the embodiment shown in FIG. 1, and thus the same reference numerals shall be used to indicate common parts, and a detailed explanation of these common parts shall be omitted.

Figure 2A:
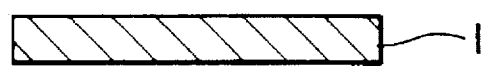
FIGS. 2(a)–2(e) are typified cross-sectional diagrams showing the order of steps of the method of forming a single crystal diamond film acording to the second embodiment of the present invention.
Figure 2B:
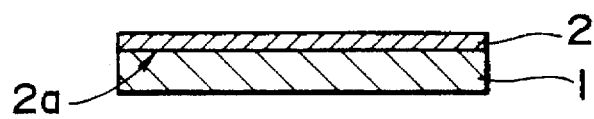
Figure 2C:
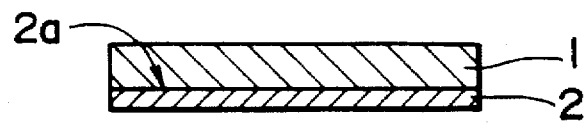
Figure 2D:
Figure 2E:

FIG. 2(a) shows first substrate (1). As shown in FIG. 2(b), a platinum film (2) having a thickness, for example, of no less than 20 μm is vapour deposited onto this first substrate (1). Then, as shown in FIG. 2(c), the first substrate (1) and platinum film (2) are subjected to annealing, after which the positions of the first substrate (1) and platinum film (2) are reversed such that the first substrate (1) is situated above the platinum film (2). Next, as shown in FIG. 2(d), the platinum film (2) and first substrate (1) are mechanically separated from each other to expose the face (join face(2a)) of the platinum film (2) that had been joined to the first substrate (1). Finally, as shown in FIG. 2(e), diamond is synthesized in the gas-phase on this join face (2a), after subjecting the join face (2a) to surface treatment, to form a single crystal diamond film (4) on the platinum film (2).

As in the method of the first embodiment, when the "join face" (2a) of the platinum film has a virtually complete crystal face, the diamond film synthesized in the gas-phase will also have a virtually complete crystal face.

Single crystal diamond films were formed using the method of the first embodiment of the present invention (FIG. 1), and the degree to which the resulting film was in single crystal form was evaluated for various conditions of synthesis by comparison with an comparative example. The results of this evaluation shall be described hereunder.

As the comparative example, a diamond film was formed by gas-phase synthesis on the growth face of a platinum film vapour-deposited on a first substrate. The method of formation was as follows. First, strontium titanate ($SrTiO_3$) having a (111) crystal face was adopted as a substrate. This substrate was then maintained at a temperature of 400° C., and a platinum film of 30 μm was vapour-deposited thereon using a magnetron sputter method, after which annealing was carried out in a vacuum at a temperature of 1200° C. for 24 hours. Reflection HEED analysis of the growth surface of the platinum film showed that it was virtually a (111) crystal face. Then, the growth surface was subjected to ultra-sound wave or buffing scratching treatment using diamond powder. Diamond was then formed on this growth face by gas-phase synthesis. The gas-phase synthesis was carried out using an NIRIM(National Institute for Research in Inorganic Materials) type or tube-type microwave CVD equipment, wherein the substrate was mounted in the reaction chamber, and maintained at a temperature between 750° C. and 890° C., whilst methane gas diluted to 0.3% with hydrogen gas was directed into the reaction chamber at a flow rate of 100 standard cubic centimeters per minute (sccm), to keep the pressure inside the reaction chamber at 40 Torr.

Figure 3:
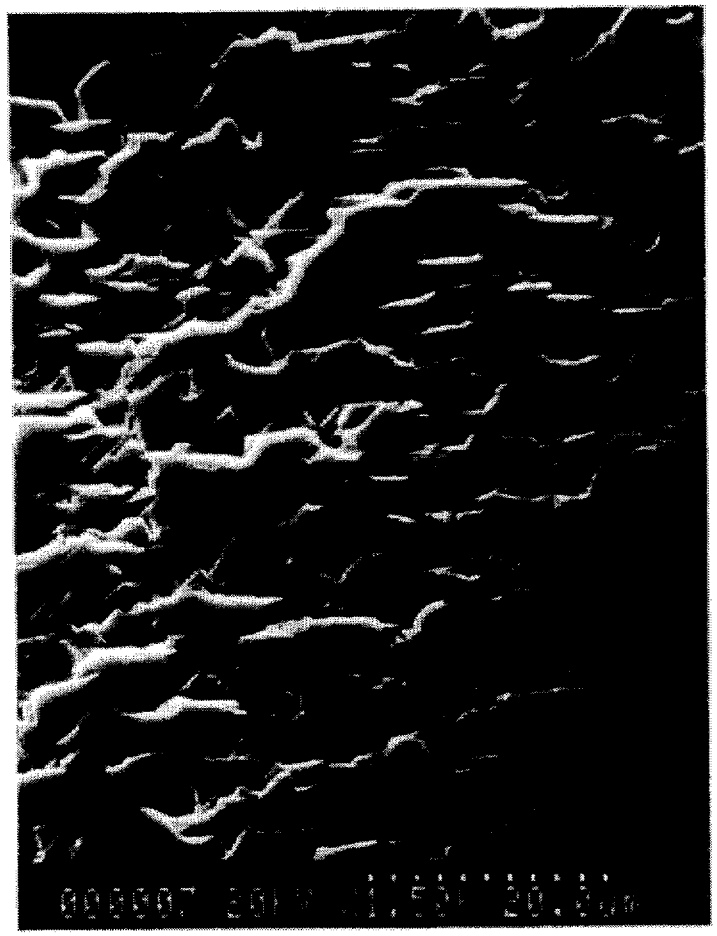
FIG. 3 is an electron microscope photograph showing the state of a diamond film growing on the (111) crystal face of a platinum film.
Figure 4:
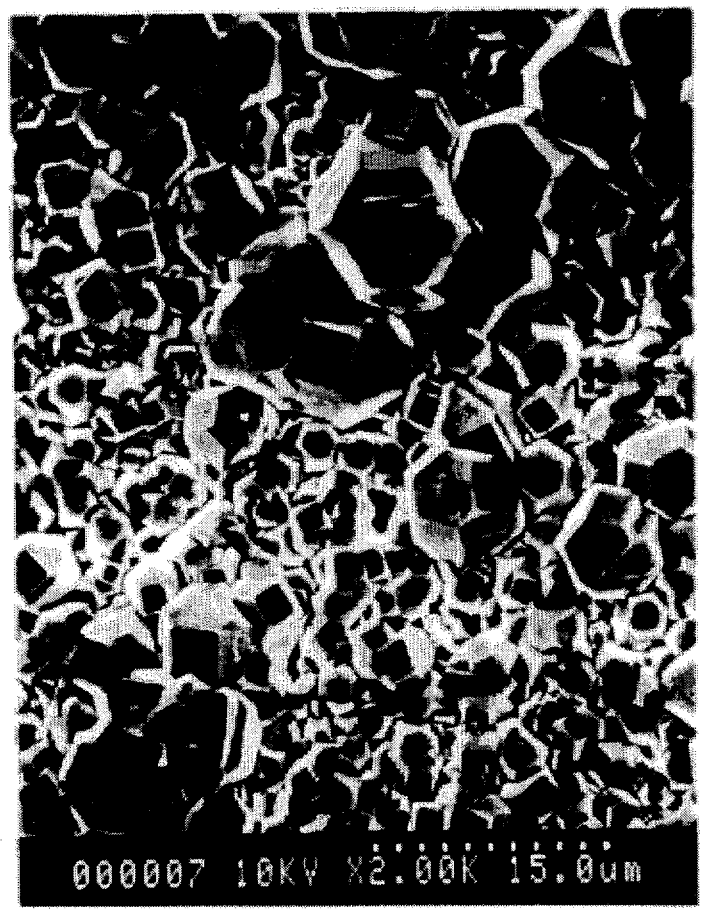
FIG. 4 is an electron microscope photograph showing a multi-crystal diamond film in which the crystal grains have cohered in an irregular manner.
Figure 5:
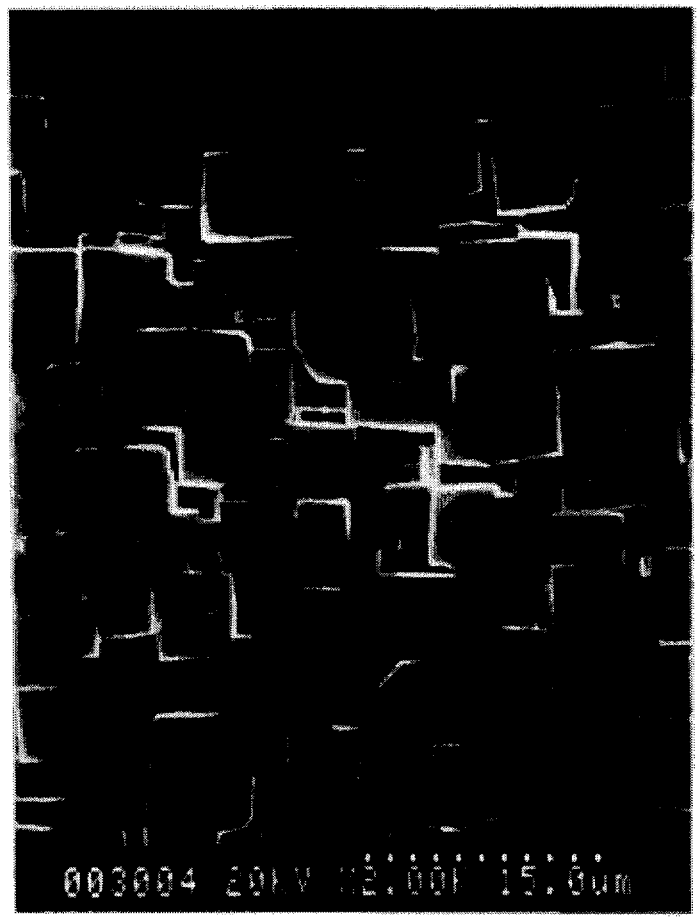
FIG. 5 is an electron microscope photograph showing a diamond film comprising a highly oriented film in which the crystal grains are virtually aligned in a certain single direction.

In the inventive examples, a diamond film was formed by gas-phase synthesis on the face of a platinum film which had once been joined to the first substrate. First, a platinum film of thickness 30 μm was vapour-deposited on a single crystal of strontium titanate under the same conditions as described for the comparative example above. Next, a Mo sheet of 0.3 mm thickness was pressed onto the platinum film, and annealing was carried out in a vacuum at a temperature of 1200° C. for 24 hours. After this, the strontium titanate and the platinum film were separated at their interface. Reflective HEED (RHEED) analysis of the join face revealed that it was virtually a (111) crystal face. Next, the join face of the platinum film was subjected to surface treatment in the same way as in the comparative example, after which diamond was formed thereon by gas-phase synthesis. During the synthesis, an electron microscope photograph was taken. FIG. 3 is an electron microscope photograph showing the state of the diamond film growing on the (111) face of the platinum film. As shown in FIG. 3, the diamond (111) crystal faces are in the process of fusing together to form a continuous single crystal film. The single crystal diamond film obtained in this way was adopted as inventive example 1.

Next, according to the same general method used to form inventive example 1, platinum based alloy films were vapour-deposited under the respective conditions shown in Table 1, subjected to annealing and surface treatments under the respective conditions shown in Table 2, and then diamond was formed thereon by gas-phase synthesis under the respective conditions shown in Table 3. The degree of orientation was then evaluated for the comparative example and inventive examples obtained in this way. The results of the evaluation are shown in Table 4.

TABLE 1

| | | Vapour-Deposition Conditions of the Platinum-based Alloy Film | | | |
|---|---|---|---|---|---|
| | No | First Substrate | Crystal Face | Platinum-based Alloy | Substrate Temperature | Film Thickness |
| Comparative Example | 1 | SrTiO$_3$ | (111) | Platinum | 400° C. | 30 μm |
| Inventive Examples | 1 | SrTiO$_3$ | (111) | Platinum | 400° C. | 30 μm |
| | 2 | SrTiO$_3$ | (001) | Platinum | 400° C. | 40 μm |
| | 3 | SrTiO$_3$ | (111) | Platinum | 400° C. | 35 μm |
| | 4 | SrTiO$_3$ | (111) | Platinum | 400° C. | 30 μm |
| | 5 | SrTiO$_3$ | (111) | Platinum | 350° C. | 28 μm |
| | 6 | SrTiO$_3$ | (001) | Platinum | 400° C. | 30 μm |
| | 7 | SrTiO$_3$ | (001) | Platinum | 400° C. | 28 μm |
| | 8 | SrTiO$_3$ | (111) | Platinum | Room Temperature | 30 μm |
| | 9 | MgO | (111) | Platinum | 500° C. | 50 μm |

TABLE 1-continued

| | | Vapour-Deposition Conditions of the Platinum-based Alloy Film | | | |
|---|---|---|---|---|---|
| | No | First Substrate | Crystal Face | Platinum-based Alloy | Substrate Temperature | Film Thickness |
| | 10 | SrTiO$_3$ | (111) | Platinum | 400° C. | 30 μm |
| | 11 | SrTiO$_3$ | (111) | 95% Platinum, 5% Gold | 400° C. | 30 μm |

TABLE 2

| | | Annealing Conditions | | |
|---|---|---|---|---|
| | No | Temperature | Time | Surface Treatment |
| Comparative Example | 1 | 1200° C. | | Ultra-sound wave scratching treatment |
| Inventive Examples | 1 | 1200° C. | 24 hours | Ultra-sound wave scratching treatments |
| | 2 | 1200° C. | 24 hours | Ultra-sound wave scratching treatment |
| | 3 | 1200° C. | 24 hours | Ultra-sound wave scratching treatment |
| | 4 | 1200° C. | 24 hours | Carbon Ion Injection |
| | 5 | 1100° C. | 24 hours | Ultra-sound wave scratching treatment |
| | 6 | 1200° C. | 24 hours | Ultra-sound wave scratching treatment |
| | 7 | 1200° C. | 24 hours | Ultra-sound wave scratching treatment |
| | 8 | 1400° C. | 36 hours | Ultra-sound wave scratching treatment |
| | 9 | 1200° C. | 24 hours | Ultra-sound wave scratching treatment |
| | 10 | 1200° C. | 24 hours | Nucleii Generation by Application of Bias Voltage |
| | 11 | 1200° C. | 24 hours | Ultra-sound wave scratching treatment |

TABLE 3

| | | Conditions of Vapour-Phase Synthesis of Diamond | | | |
|---|---|---|---|---|---|
| | No | Crystal Face | Synthesis Method | Reactant Gas | Synthesis Time |
| Comparative Example | 1 | Growth Face | Microwave CVD | CH$_4$ 0.3%, H$_2$ | 30 hours |
| Inventive Examples | 1 | Join Face | Microwave CVD | CH$_4$ 0.3%, H$_2$ | 30 hours |
| | 2 | Join Face | Microwave CVD | CH$_4$ 0.5%, H$_2$ | 10 hours |
| | 3 | Join Face | Hot Filament CVD | CH$_4$ 0.3%, H$_2$ | 20 hours |
| | 4 | Join Face | Microwave CVD | CH$_4$ 0.3%, H$_2$ | 25 hours |
| | 5 | Join Face | Microwave CVD | CO 0.5%, H$_2$ | 30 hours |
| | 6 | Join Face | Microwave CVD | CH$_4$ 5%, O$_2$ 1%, H$_2$ | 10 hours |
| | 7 | Join Face | Hot Filament CVD | Ethanol 1%, H$_2$ | 8 hours |
| | 8 | Join Face | Microwave CVD | CH$_4$ 0.3%, H$_2$ | 30 hours |
| | 9 | Join Face | Microwave CVD | CH$_4$ 0.3%, H$_2$ | 30 hours |

TABLE 3-continued

| | | Conditions of Vapour-Phase Synthesis of Diamond | | |
|---|---|---|---|---|
| No | Crystal Face | Synthesis Method | Reactant Gas | Synthesis Time |
| 10 | Join Face | Microwave CVD | CH$_4$ 0.3%, H$_2$ | 30 hours |
| 11 | Join Face | Microwave CVD | CH$_4$ 0.3%, H$_2$ | 30 hours |

TABLE 4

| | | Result of Assessment of Degree of Orientation | |
|---|---|---|---|
| | No | Crystal Face | Degree of Orientation |
| Comparative Example | 1 | (111) | 85% |
| Inventive Examples | 1 | (111) | 97% |
| | 2 | (001) | 92% |
| | 3 | (111) | 90% |
| | 4 | (111) | 90% |
| | 5 | (111) | 94% |
| | 6 | (001) | 92% |
| | 7 | (001) | 90% |
| | 8 | (111) | 94% |
| | 9 | (111) | 90% |
| | 10 | (111) | 97% |
| | 11 | (111) | 98% |

In Inventive Example 1, grain-shaped diamond whose crystal orientation was aligned to a certain degree, was precipitated 10 hours after commencing synthesis, and as shown in Table 3, under the conditions of all the inventive examples and the comparative example adjoining grains of diamond coalesced after a time ranging between 8 and 30 hours from the start of synthesis. Furthermore, as shown in Tables 1 and 4, a continuous single crystal diamond film having a crystal face identical to that of the platinum-based alloy was formed. However, whereas in the case of inventive examples 1 to 11 the degree of orientation was between 90% and 98% under each of the conditions shown in Tables 1 to 3, the degree of orientation of the comparative example was 85%, showing a large degree of disarray away from a single crystalline state compared to the inventive examples.

As mentioned above, according to the present invention, a platinum-based alloy film is vapour-deposited onto a first substrate, and diamond is formed by gas-phase synthesis on the face of the platinum film which was once joined to the first substrate, whereby a single crystal diamond film of large area and high crystallinity can be formed at low cost. Since, it is thus now possible according to the present invention to form a single crystal diamond film by gas-phase synthesis, single crystal diamond can now be used in a wide range of field of applications in which practical use thereof had hereto been difficult, and thus the present invention represents a large contribution to development in this technical field.

What is claimed is:

1. A method for forming a single crystal diamond film comprising the step of synthesizing the diamond film on a vapor-deposited film of platinum or a platinum alloy containing at least 50% (at.) platinum whose surface comprises a (001) or (111) crystal face, wherein the surface of the vapor-deposited film upon which the diamond film is synthesized corresponds to the surface of the vapor-deposited film which has been joined to a substrate upon which the vapor-deposited film was formed.

2. The method according to claim 1 wherein the vapor-deposited film is formed by the steps of: (i) vapor-depositing a film of platinum or a platinum alloy containing at least 50% (at.) platinum on a first substrate; (ii) subjecting the vapor-deposited film to an annealing treatment; and (iii) separating the vapor-deposited film from the first substrate.

3. The method according to claim 2 further comprising the step of pressing a second substrate onto the surface of the vapor-deposited film between steps (i) and (ii), or between steps (ii) and (iii).

4. The method according to claim 2 further comprising the step of subjecting the surface of the vapor-deposited film upon which the diamond film is to be synthesized to a surface treatment between step (iii) and the step of synthesizing the diamond film.

5. The method according to claim 4 wherein the surface treatment is an ultrasound wave or buffing scratching treatment using diamond powder or diamond paste, or a carbon ion injection treatment.

6. The method for forming a single crystal diamond film according to claim 2, wherein the first substrate consists of one material selected from the group consisting of: lithium fluoride, calcium fluoride, magnesium oxide, nickel oxide, zirconium oxide, aluminum oxide, strontium titanate, barium titanate, lead titanate, galium tantalate, and lithium niobate; and in that the surface of the first substrate has a (111) crystal face or a (001) crystal face.

7. The method for forming a single crystal diamond film according to claim 2 wherein the first substrate consists of one material selected from the group consisting of: silicon, quartz and glass.

8. The method for forming a single crystal diamond film according to claim 1 wherein the platinum alloy includes at least one element from group 6A, group 7A, group 8 or group 1B of the periodic table.

9. The method for forming a single crystal diamond film according to claim 2 wherein the substrate temperature when the vapor-deposited film is formed is no greater than 1000° C.

10. The method for forming a single crystal diamond film according to claim 2 wherein the temperature of the substrate when the vapor-deposited film is formed is between 300° C. and 1000° C.

11. The method for forming a single crystal diamond film according to claim 2 wherein the annealing temperature is no less than 500° C.

12. The method for forming a single crystal diamond film according to claim 11, wherein the annealing temperature is no less than 1000° C.

* * * * *